United States Patent [19]

Hannai

[11] Patent Number: 4,947,377
[45] Date of Patent: Aug. 7, 1990

[54] SEMICONDUCTOR MEMORY DEVICE HAVING IMPROVED SENSE AMPLIFIER ARRANGEMENT

[75] Inventor: Seiichi Hannai, Tokyo, Japan

[73] Assignee: NEC Corporation, Tokyo, Japan

[21] Appl. No.: 181,950

[22] Filed: Apr. 15, 1988

[30] Foreign Application Priority Data

Apr. 15, 1987 [JP] Japan .................................. 62-92909

[51] Int. Cl.⁵ .............................................. G11C 7/02
[52] U.S. Cl. .................................. 365/208; 365/149; 365/205; 365/210
[58] Field of Search ............... 365/205, 207, 208, 149, 365/210; 307/530

[56] References Cited

U.S. PATENT DOCUMENTS 4,656,613 4/1987 Norwood et al. ................. 365/210

Primary Examiner—James W. Moffitt
Attorney, Agent, or Firm—Sughrue, Mion, Zinn, Macpeak & Seas

[57] ABSTRACT

A semiconductor memory device having an improved arrangement of bit lines which can operates stably, is disclosed. The memory device comprises a plurality of first bit line pairs, a plurality of second bit line pairs, and a plurality of sense amplifiers, a control circuit for connecting either of the first bit line pairs and the second bit line pairs to the sense amplifiers, and is featured in that the first and second bit line pairs are alternately arranged in parallel one by one.

4 Claims, 3 Drawing Sheets

SEMICONDUCTOR MEMORY DEVICE HAVING IMPROVED SENSE AMPLIFIER ARRANGEMENT

BACKGROUND OF THE INVENTION

The present invention relates to a semiconductor memory device, and more particularly to a dynamic type semiconductor memory device employing so-called shared sense amplifier scheme.

Semiconductor memory devices have come to have large memory capacities such as 256K bits, 1 Mega bits, and the internal signals read-out from memory cells are reduced to a minute level. In such memory devices, those employing one-transistor type memory cells having one transistor and one capacitor are generally utilized. In accompanied by the increase in the memory capacity, the number of memory cells coupled to the respective bit line has become large and effective capacitance of the respective bit line has also become large. This increase in the bit line capacitance lowers a potential change at the bit line by the read-out signal from a memory cell.

Under such circumstance, the so-called shared sense amplifier scheme has been proposed. According to the shared sense amplifier scheme, the respective pair of bit lines are splitted into two pairs of first and second bit line segments and one pair of the bit line segments are electrically connected to a sense amplifier. The details of the shared sense amplifier scheme is disclosed in the U.S. Pat. No. 4,366,559 issued to Misaizu et al. In the shared sense amplifier scheme, it has been practised to arrange a plurality pairs of first bit line segments in parallel at one side of sense amplifiers arranged in line and a plurality pairs of second bit line segments in parallel at the other side of the sense amplifiers. Accordingly, in the shared sense amplifier, the capacitance of the respective bit line segment is reduced to half as compared to the conventional scheme, and it is possible to perform more stable and reliable sensing operation.

The conventional semiconductor memory device suffers, however, from the problem concerning the noise generated by coupling capacitance ($C_{BB}$) between the bit lines arranged in parallel. Considering this problem in regard to the so-called folded bit line arrangement, a pair of bit lines which are connected to the same sense amplifier are always in anti-phase relation to each other when activated and therefore act so as to reduce the differential potential between the true and complementary bit lines constituting the bit line pair. When bit line pairs which are adjacent to the certain bit line pair concerned act in anti-phase relation to the certain bit line pair also, the coupling capacitance $C_{BB}$ between the certain bit line pair and the adjacent bit line pairs acts so as to reduce the differential potential between the bit lines of the certain bit line pair.

In other words, the coupling capacitance $C_{BB}$ between the bit lines substantially causes lowering in the sensitivity of the sense amplifier. As the integration density and the memory capacity are increased and the spacing between the wirings is consequently reduced, that is, as the spacing between the bit lines is reduced, the coupling capacitance $C_{BB}$ increases and becomes a critical problem.

Thus, the memory device employing the folded bit line scheme is readily affected by the noise generated by the coupling capacitance between the bit lines.

SUMMARY OF THE INVENTION

It is an object of the present invention to provide a semiconductor memory device which has improved sensitivity and stability in sensing stored information.

It is another object of the present invention to provide a semiconductor memory device having the improved shared sense amplifier scheme.

The semiconductor memory device according to the present invention comprises a plurality of first bit line pairs, a plurality of second bit line pairs, a plurality of sense amplifiers, a control circuit for electrically connecting either of the first bit line pairs and the second bit line pairs to the sense amplifiers during a sense period, and is featured in that the plurality of first bit line pairs and the second bit line pairs are alternately arranged in parallel.

Accordingly, the non-selected, or non-activated bit line pair is necessarily interposed between every two activated bit line pairs, and the effective capacitance between the every two activated bit line pairs. Thus, noise between the activated bit line pairs can be remarkably reduced.

For example, when the first bit line pairs are selected and connected to the sense amplifiers, the second bit line pairs are not connected to the sense amplifiers for amplification. Therefore, the potential change in one of the first bit line pairs caused by the sense amplifier is not directly transmitted to other first bit line pairs near the above one bit line pair via the coupling capacitance $C_{BB}$ because the second bit line pair which is not subjected to the potential, is interposed therebetween.

DETAILED DESCRIPTION OF THE INVENTION

Figure 1:
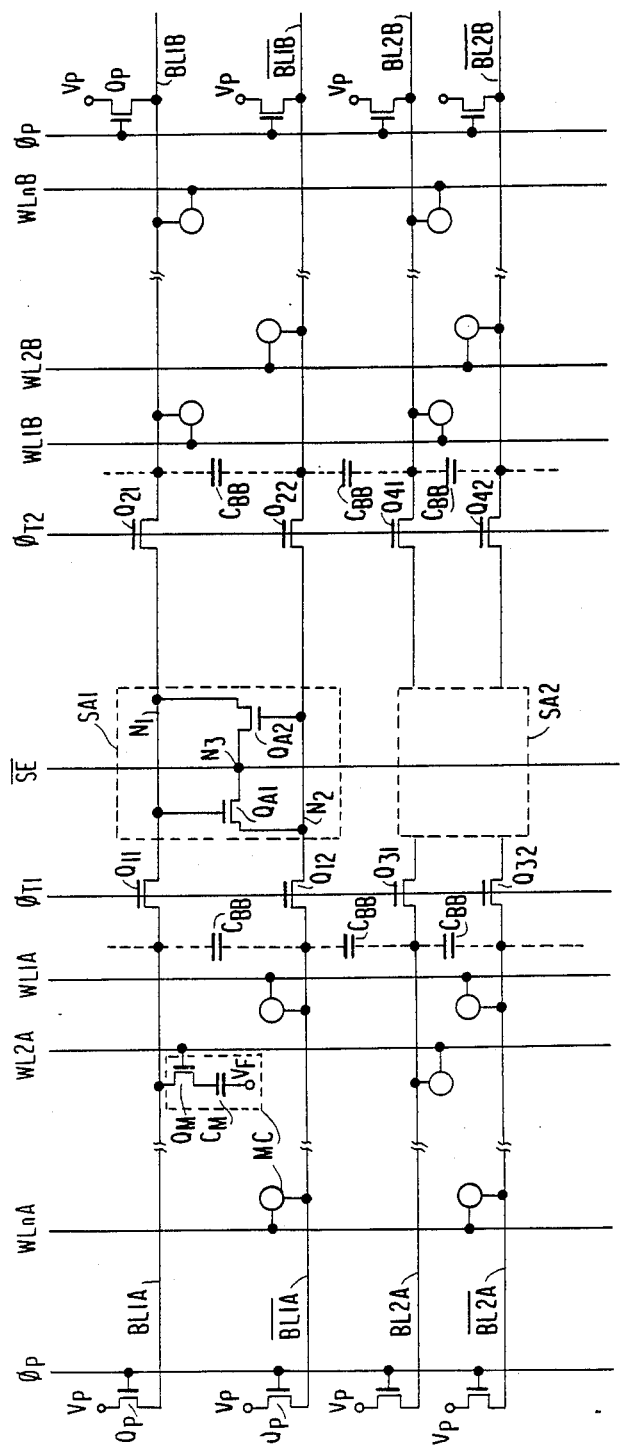
FIG. 1 is a schematic block diagram showing major part of the conventional shared sense amplifier scheme.

Referring to FIG. 1, the conventional memory device employing the shared sense amplifier scheme is explained.

By way of explanation, two columns of arrangement are representatively illustrated in FIG. 1.

Sense amplifiers SA1, SA2 . . . are arranged in row in line. Each of the sense amplifiers includes a pair of flip-flop transistors $QA_1$ and $QA_2$, a pair of sense nodes $N_1$, $N_2$ and a sense enable node $N_3$. The sense enable nodes $N_3$ of all the sense amplifiers are supplied with a sense enable signal $\overline{SE}$ in common.

On the left side of the arrangement of the sense amplifiers, a plurality of memory cells MC are arranged in a matrix form rows and columns and a plurality of word lines WL1A–WLnA and a plurality of pairs of bit lines BL1A, $\overline{BL1A}$, BL2A, $\overline{BL2A}$ . . . are also arranged in rows and columns, respectively.

Similarly, on the right side of the sense amplifiers a plurality of memory cells are arranged with word lines WL1B–WLnB and a plurality of pairs of bit lines. The pair of bit lines BL1A, $\overline{BL1A}$ and the pair of bit lines BL1B, $\overline{BL1B}$ belong to the same column and correspond to the pair of first bit line segments and the pair of second bit line segments, in the sense of the foregoing explanation. However, in the simplicity of explations, those are simply referred to as bit lines.

The pairs of bit lines BL1A, $\overline{BL1A}$ ... on the left side are connected to the sense amplifiers via a plurality pairs of transfer gate field effect transistors $Q_{11}$, $Q_{12}$, $Q_{31}$, $Q_{32}$ ..., respectively. Similarly, the pairs of bit lines BL1B, $\overline{BL1B}$, BL2B, $\overline{BL2B}$ ... on the right side are connected to the sense amplifiers via a plurality pairs of transfer gates $Q_{21}$, $Q_{22}$, $Q_{41}$, $Q_{44}$ ... respectively. Precharge transistors $Q_p$ are connected between the bit lines and a precharge potential $V_p$.

As is seen from FIG. 1, the coupling capacitance $C_{BB}$ is present between every adjacent bit lines arranged in parallel.

The operation of the memory of FIG. 1 is as follows:

First, a precharge control signal $\phi_p$ is raised to a power voltage $V_{DD}$ or more to make the precharge transistors $Q_p$ conductive so that the bit lines are precharged to $V_p$. In this instance, control signals $\phi T_1$ and $\phi T_2$ are both raised to a high level to render all of the transfer gates Q11, Q12, Q21, and Q27 conductive so that the sense nodes $N_1$ and $N_2$ of the respective sense amplifiers are also precharged. In this instance, the sense enable nodes N3, i.e. of the respective sense amplifiers are also precharged to the precharge potential $V_p$.

Then, a sense period is introduced and one of word lines is selected according to address information and one of the control signals $\phi T_1$ and $\phi T_2$ is selected. For example, the word lines on the left side e.g. WL1A, is selected, the control signal $\phi T_1$ remains active while the control signal $\phi T_2$ is rendered inactive. Thus, the bit lines on the left side are connected to the sense amplifiers and the bit lines on the right side are electrically isolated from the sense amplifiers.

The memory cells coupled to the selected word line provide small potential difference in the respective pairs of bit lines in the left side.

Then the sense enable signal $\overline{SE}$ is gradually changed to a low level from the precharge level so that the potential differences in the respective bit line pairs on the left side are amplified by the sense amplifiers enabled by $\overline{SE}$. Through the amplification by the sense amplifiers, one bit line e.g. BL1A having a lower potential is discharged to the ground potential while the other bit line e.g. $\overline{BL1A}$ of a higher potential remains at a high level or is made further high, in each bit line pairs. In this instance, assuming that the adjacent bit line, e.g. BL2A in the adjacent bit line pair is changed to the low level, the bit line ($\overline{BL1A}$) of the high level is inevitably affected by the two adjacent bit lines (BL2A, BL1A) of the low level via the coupling capacitances $C_{BB}$. Thus, the level of the bit line $\overline{BL1A}$ is undesirably lowered.

Throughout the amplification of the bit line pairs on the left side, the bit line pairs on the right side are left in the high impedance, precharged state.

Thus, the conventional memory device of FIG. 1 suffers from the noise generated by the coupling capacitance $C_{BB}$ between the every adjacent bit lines.

Figure 2:
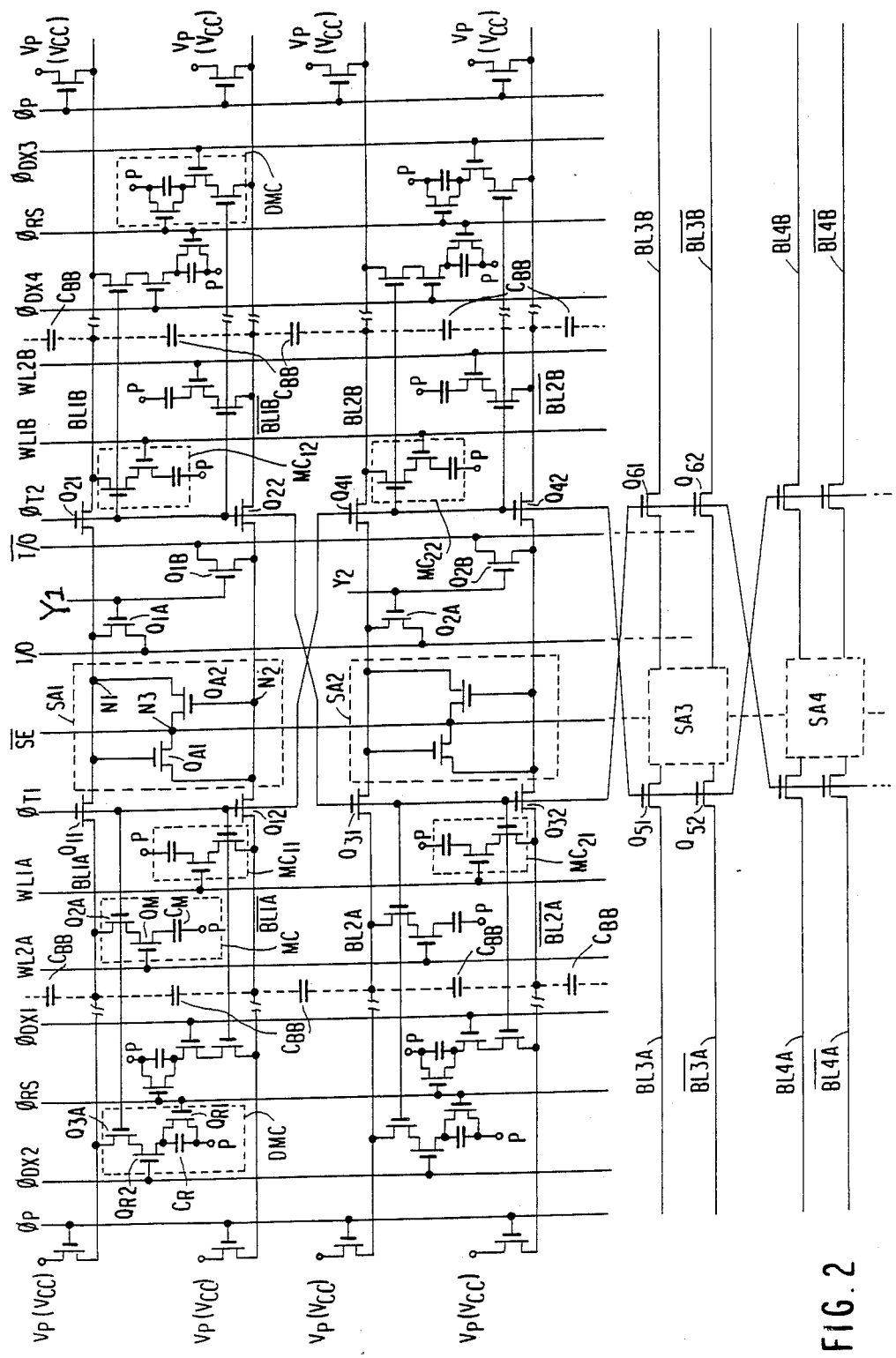
FIG. 2 is a schematic block diagram showing major part of the memory device according to one embodiment of the present invention.

Referring to FIG. 2, the memory device according to one preferred embodiment of the present invention will be explained.

In FIG. 2, the elements or portions corresponding to those in FIG. 1 are denoted by the same or similar references, and the detailed feature with respect to the sense amplifiers SA3, SA4 and their relevant cell arrangements is not illustrated because they are repetition of those with respect to the sense amplifiers SA1 and SA2.

The present embodiment is featured in that a plurality of transfer gate pairs ($Q_{11}$, $Q_{12}$; $Q_{31}$, $Q_{32}$; $Q_{51}$, $Q_{52}$ ...) for connecting the bit lines pairs on the left side are alternately controlled by the control signals $\phi T_1$ and $\phi T_2$.

Similarly, a plurality of transfer gate pairs ($Q_{21}$, $Q_{22}$; $Q_{41}$, $Q_{42}$; $Q_{61}$, $Q_{62}$; ...) for connecting the bit line pairs in the right side to the sense amplifiers SA1, SA2 SA3 ... are alternately controlled by the control signals $\phi T_2$ and $\phi T_1$, as illustrated.

Thus, in each side, only one bit line pair in every two adjacent bit line pairs is coupled to the sense amplifier while the other bit line pair in the every two adjacent bit line pairs is not coupled to the sense amplifier but left in the floating, high impedance state.

In this embodiment, a pair of bus lines I/O and $\overline{I/O}$ are provided along the sense amplifiers and coupled to the sense nodes $N_1$ and $N_2$ of the respective sense amplifiers via a plurality of transfer gate pairs ($Q_{1A}$, $Q_{1B}$; $Q_{2A}$, $Q_{2B}$ ...) controlled by column selection signals $Y_1$, $Y_2$ ..., respectively. Each of memory cells MC includes an additional transfer gate transistor $Q_{2A}$ which is controlled by the relevant one of the control signals $\phi T_1$ and $\phi T_2$, in addition to the conventional cell transistor $Q_M$ and the cell capacitor $C_M$. Each of dummy cells DMC includes also an additional transistor $Q_{3A}$ controlled by the relevant control signal $\phi T_1$ or $\phi T_2$, in addition to a dummy cell transistor $Q_{R2}$, a reset transistor $Q_{R1}$ and a capacitor $C_R$. The gates of the transistors $Q_{R2}$ and $Q_{R1}$ are connected to a dummy word line $\phi_{DX}$ and a reset control line $\phi_{RS}$.

The operation of the device of FIG. 2 is as follows:

After the precharge operation for the bit lines by the precharge transistors $Q_p$, one of the word lines WL1A ... on the left side and one of the word lines WL1B ... on the right side are simultaneously selected. Also, according to a part of address information, one of the control signals $\phi T_1$ and $\phi T_2$ is activated. Assuming that the control signal $\phi T_1$ is activated and WL1A and WL1B are selected, the memory cells $MC_{11}$, $MC_{22}$ are activated while the memory cells $MC_{12}$, $MC_{21}$ are not activated and the bit line pairs (BL1A, $\overline{BL1A}$; BL2B, $\overline{BL2B}$) connected to the activated memory cells are electrically connected to the sense amplifiers SA1, SA2, respectively and subjected to amplification thereby. While the bit line pairs (BL1B, $\overline{BL1B}$; BL2A, $\overline{BL2A}$) connected to non-activated memory cells are electrically isolated from the sense amplifiers SA1, SA2 ... Therefore, the selected bit line pair, e.g. BL1A, $\overline{BL1A}$ is not affected by the potential change in the adjacent bit line pairs, e.g. BL2A, $\overline{BL2A}$.

Figure 3:
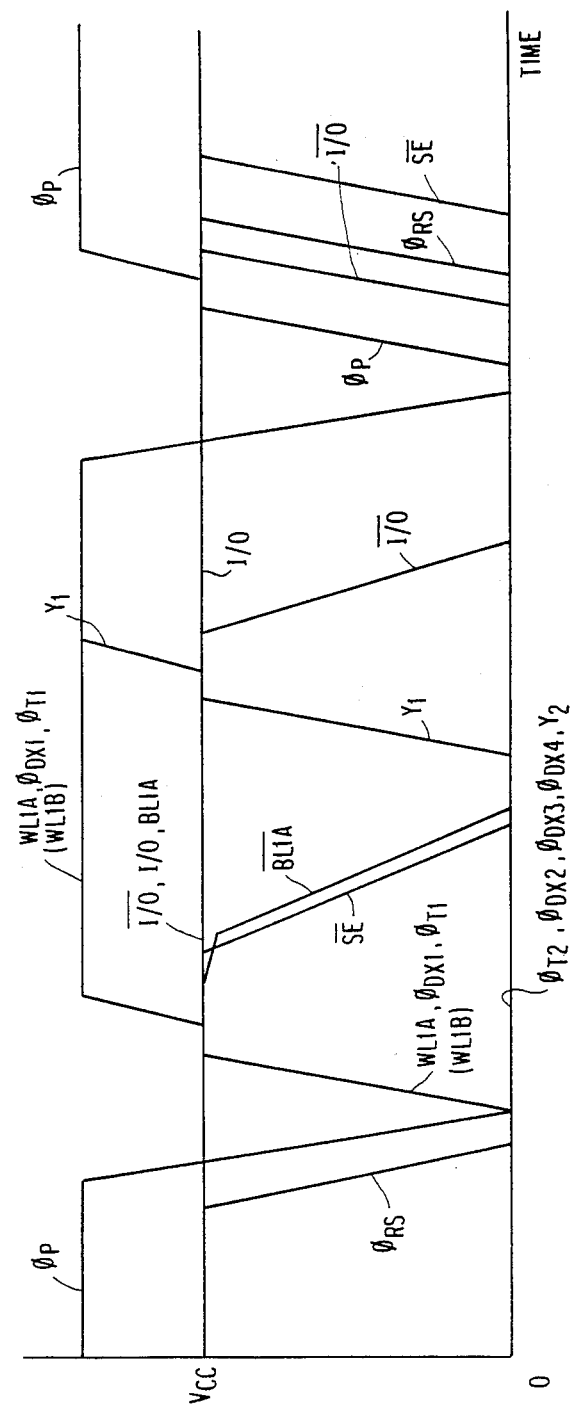
FIG. 3 is a timing diagram of the device of FIG. 2.

Waveforms of the major portions in FIG. 2 is illustrated in FIG. 3.

With the above-described circuit configuration, it is possible to reduce considerably the interference between the adjacent bit line pairs. This is because a bit line pair which is in a floating state is infallibly provided between the activated bit line pairs to reduce the coupling capacitance between the activated bit line pairs.

I claim:

1. A semiconductor memory device comprising a plurality of memory cells arranged in a plurality of columns running in parallel, said columns being alternately classified into a first group of columns and a second group of columns according to their locations, each of said first group of columns including a first sense amplifier, a first bit line pair arranged on one side of said first sense amplifier, a second bit line pair arranged on the other side of said first sense amplifier, a first means for operatively connecting said first bit line pair to said first sense amplifier, and second means for operatively connecting said second bit line pair to said first sense amplifier, said second group of columns including a second sense amplifier, a third bit line pair arranged on one side of said second sense amplifier, a fourth bit line pair arranged on the other side of said second sense amplifier, third means for operatively connecting said third bit line pair to said second sense amplifier, and fourth means for operatively connecting said fourth bit line pair to said second sense amplifier, each of said first bit line pairs being positioned adjacently to each of said third bit line pairs in parallel, each of said second bit line pairs being positioned adjacently to each of said fourth bit line pairs; means for activating said first and second sense amplifiers simultaneously during a sensing period and control means for controlling said first to fourth means in a first state that said first and third means are enabled and said second and fourth means are disenabled during said sensing period and a second state that said second and fourth means are enabled and said first and third means are disenabled during said sensing period.

2. The memory device according to claim 1, in which each of said first to fourth means includes a transfer gate pair for connecting the associated said bit line pair to the associated sense amplifier.

3. The memory device according to claim 1, in which each of said first and second columns includes a plurality of memory cells, each of said memory cells having a capacitor and a series circuit of first and second transistors coupled between one end of said capacitor and one of bit lines in each bit line pair, a gate of one of said first and second transistors being connected to one of word lines, a gate of the other of said first and second transistors being connected to said control circuit.

4. The memory device according to claim 3, further comprising precharging means for operatively precharging said first to fourth bit line pairs to a precharge potential.

* * * * *